(12) United States Patent
Goda (10) Patent No.: US 7,508,711 B2
(45) Date of Patent: Mar. 24, 2009

(54) ARRANGEMENTS FOR OPERATING A MEMORY CIRCUIT

(75) Inventor: Akira Goda, Boise, ID (US)

(73) Assignee: Intel Corporation, Santa Clara, CA (US)

( * ) Notice: Subject to any disclaimer, the term of this patent is extended or adjusted under 35 U.S.C. 154(b) by 33 days.

(21) Appl. No.: 11/796,836

(22) Filed: Apr. 30, 2007

(65) Prior Publication Data

US 2008/0266978 A1    Oct. 30, 2008

(51) Int. Cl.
   *G11C 16/04*    (2006.01)
(52) U.S. Cl. .......................... 365/185.17; 365/185.03; 365/185.11; 365/185.12; 365/185.22
(58) Field of Classification Search ............ 365/185.17, 365/185.03, 185.11, 185.12, 185.22
   See application file for complete search history.

(56) References Cited

U.S. PATENT DOCUMENTS

| | | | |
|---|---|---|---|
| 5,428,569 A | 6/1995 | Kato | |
| 5,986,933 A | 11/1999 | Takeuchi | |
| 6,028,794 A | 2/2000 | Nakai | |
| 6,288,935 B1 | 9/2001 | Shibata | |
| 6,373,746 B1 | 4/2002 | Takeuchi | |
| 6,657,891 B1 | 12/2003 | Shibata | |
| 7,274,594 B2 * | 9/2007 | Pascucci et al. | ......... 365/185.11 |
| 2007/0058432 A1 * | 3/2007 | Hosono | ................. 365/185.11 |
| 2008/0158952 A1 * | 7/2008 | Aritome | ................. 365/185.03 |

* cited by examiner

*Primary Examiner*—Connie C Yoha
(74) *Attorney, Agent, or Firm*—Schubert Osterrieder & Nickelson PLLC (57) ABSTRACT

In one embodiment a method for programming memory cells is disclosed. The method can include applying a programming voltage to a selected memory cell during a lower page programming procedure, the selected memory cell can be part of a string of memory cells containing unselected memory cells, where the string of cells have a source side between the selected memory cell and a source line and have a drain side between the selected memory cell and bit line. The method can also include applying pass voltages to the unselected memory cells during the lower page programming procedure and applying pass voltages to the unselected memory cells during the upper cell programming procedure. The pass voltages can be higher during the upper page programming than during the lower page programming procedure.

14 Claims, 5 Drawing Sheets

ARRANGEMENTS FOR OPERATING A MEMORY CIRCUIT

FIELD OF DISCLOSURE

The present disclosure is related to the field of electronics and more particularly to the field of operating a memory circuit.

BACKGROUND

Memory devices and systems are common in computers and other electronic devices. There are many different types of memory including flash memory. Flash memory devices have developed into a popular source of non-volatile memory for a wide range of electronic applications. Flash memory devices typically use a one-transistor memory cell that allows for high memory densities, high reliability, and low power consumption. Common uses for flash memory include personal computers, personal digital assistants (PDAs), digital cameras, and cellular telephones. Two common types of flash memory array architectures are the "NAND" and "NOR" architectures, so called for the logical form in which the basic memory cell configuration or each is arranged. A NAND array can have memory cells that employ a single field effect transistor (FET). The cells can be arranged in an array where the transistors/cells have floating gates in a matrix such that the gates of each floating gate memory cell of the array are coupled by rows to word select lines. Each memory cell in the array is coupled together in series or in a string configuration, source to drain, between a source line and a column bit line.

A typical floating gate memory cell is fabricated in an integrated circuit substrate and includes a source region and a drain region that is spaced apart from the source region to form an intermediate channel region. A conductive floating gate, typically made of doped polysilicon, or non-conductive charge trapping layer (a floating node), such as nitride (as would be utilized in a silicon-oxide-nitride-oxide-silicon or SONOS gate-insulator stack), is disposed over the channel region and is electrically isolated from the other cell elements by a dielectric material, typically an oxide.

A tunnel oxide can be formed between the floating gate/node and the channel region. A control gate can be located over the floating gate/node and is typically made of doped polysilicon or metal. The control gate can be electrically separated from the floating gate/node by another dielectric layer. Thus, the floating gate or charge trapping layer/floating node is "floating" in dielectric so that it is insulated from both the channel and the control gate. Charge is transported to, or removed from the floating gate or trapping layer by specialized programming and erase operations, respectively, altering the threshold voltage of the device. In accordance with the embodiments provided herein, improved methods for programming and altering the threshold voltage of memory cells/transistors is disclosed As stated above, an array of cells/transistors can be coupled together in series, source to drain, between a source line and a column bit line. In practice, a string typically has 8, 16, 32, or more cells. Each floating gate/node memory cell FET has a gate-insulator stack formed over the channel region. In one embodiment, each string can be formed in an isolation trench, allowing the substrate of each isolation trench to be individually biased for programming and erasure. In each NAND memory string, impurity (N+ typically) doped regions can be formed between each gate insulator stack to form the source and drain regions of the adjacent memory cells, which additionally can operate as connectors to couple the cells of the NAND string together. In one embodiment, the N+doped regions can be omitted and a single channel region is formed under the NAND memory string, coupling the individual memory cells. The disclosed NAND memory can be implemented with silicon-on-sapphire (SOS) technology, silicon-on-insulator (SOI) technology, thin film transistor (TFT) technology, doped and undoped semiconductors, epitaxial layers of silicon supported by a base semiconductor structure, as well as other semiconductor structures known in the art.

Each transistor can be viewed as a single memory cell and a memory array can have millions of cells. Such a memory cell configuration can be accessed by a row decoder activating a row of memory cells by selecting the word select line (WL) coupled to transistor gates. In addition, the word lines coupled to the gates of the unselected memory cells of each string can also be driven during reading writing/programming and erasing procedures. However, the unselected memory cells of each string are typically driven at a higher gate voltage so as to operate them as pass transistors allowing unselected cells to pass current in a manner that is unrestricted by their stored data values.

BRIEF DESCRIPTION OF THE DRAWINGS

Aspects of the disclosure will become apparent upon reading the following detailed description and upon reference to the accompanying drawings in which, like references may indicate similar elements.

DETAILED DESCRIPTION OF EMBODIMENTS

The following is a detailed description of embodiments of the disclosure depicted in the accompanying drawings. The embodiments are in such detail as to clearly communicate the disclosure. However, the amount of detail offered is not intended to limit the anticipated variations of embodiments; on the contrary, the intention is to cover all modifications, equivalents, and alternatives falling within the spirit and scope of the present disclosure as defined by the appended claims.

While specific embodiments will be described below with reference to particular configurations of hardware and/or software, those of skill in the art will realize that embodiments of the present disclosure may advantageously be implemented with other equivalent hardware and/or software systems. Aspects of the disclosure described herein may be stored or distributed on computer-readable media, including magnetic and optically readable and removable computer disks, as well as distributed electronically over the Internet or over other networks, including wireless networks. Data structures and transmission of data (including wireless transmission) particular to aspects of the disclosure are also encompassed within the scope of the disclosure.

In another embodiment, a method for programming NAND memory is disclosed. The method can include applying a programming voltage to a selected cell during a lower page programming procedure wherein the selected memory cell is part of a string of memory cells containing unselected memory cells and applying pass voltages to the unselected cells during the lower page programming procedure. In addition a programming voltage can be applied to the selected cell during an upper page programming procedure and pass voltages can be applied to the unselected memory cells during the upper page programming procedure. The pass voltages applied during the upper page programming procedure being higher than the pass voltages applied during the lower page programming procedure.

In one embodiment a NAND memory system is disclosed. The memory system can include a string of memory cells, the string having a first end coupled to a source line and each memory cell can individually be selected for programming. A bit line can be coupled to a second end of the string where the string has a drain side between the selected cell and the bit line and a source side between the source line and the selected cell. A controllable voltage source can be coupled to the series of gate lines to provide a plurality of pass voltages to the series of gate lines in the string of memory cells. The controllable voltage source can provide an upper page programming voltage and a lower page programming to the selected cell wherein a higher pass voltage is utilized during the upper page programming than during the lower page programming.

Figure 1A:
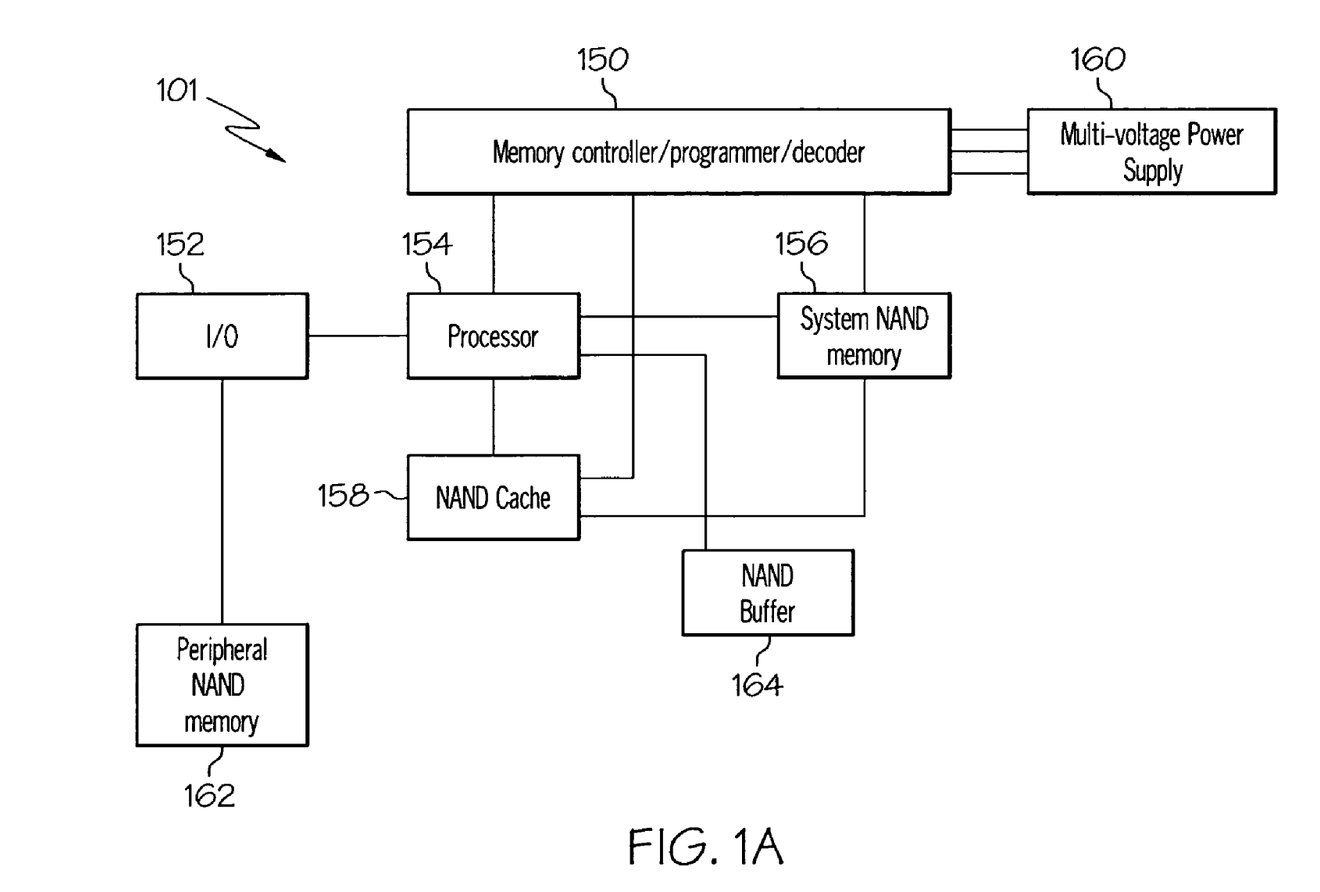
FIG. 1A is a block diagram of a processing system with NAND memory.

Referring to FIG. 1A a block diagram of a computing system 101 that utilized NAND type memory is illustrated. The system 101 can include a processor 154, system NAND type memory 156, memory controller/programmed/decoder 150, a multi-voltage power supply 160, NAND buffer 164, NAND cache 158, an input output (I/O) controller 152, and peripheral NAND memory 162.

In operation, the processor 154 can execute instructions and when the processor needs additional instructions or needs data, the processor 154 can access instructions or data from many memory locations. For example, the processor 154 can retrieve data and instructions from NAND cache 158, NAND system memory 156, NAND buffer 164 and peripheral NAND memory 162 with the assistance of memory controller/programmer/decoder 150. The peripheral NAND memory 162 can be a small solid state storage with a uniform serial bus (USB) connector.

Multi-voltage power supply 150 can provide many different voltages to the memory controller/programmer/decoder 150 and in turn the memory controller/programmer decoder 150 can write data to, and read data from, the different NAND type memories (i.e. 162, 158, 164, and 156). The new techniques and technologies disclosed herein can increase the performance of NAND type memories and accordingly NAND type memory can be utilized virtually anywhere memory is needed.

Figure 1B:
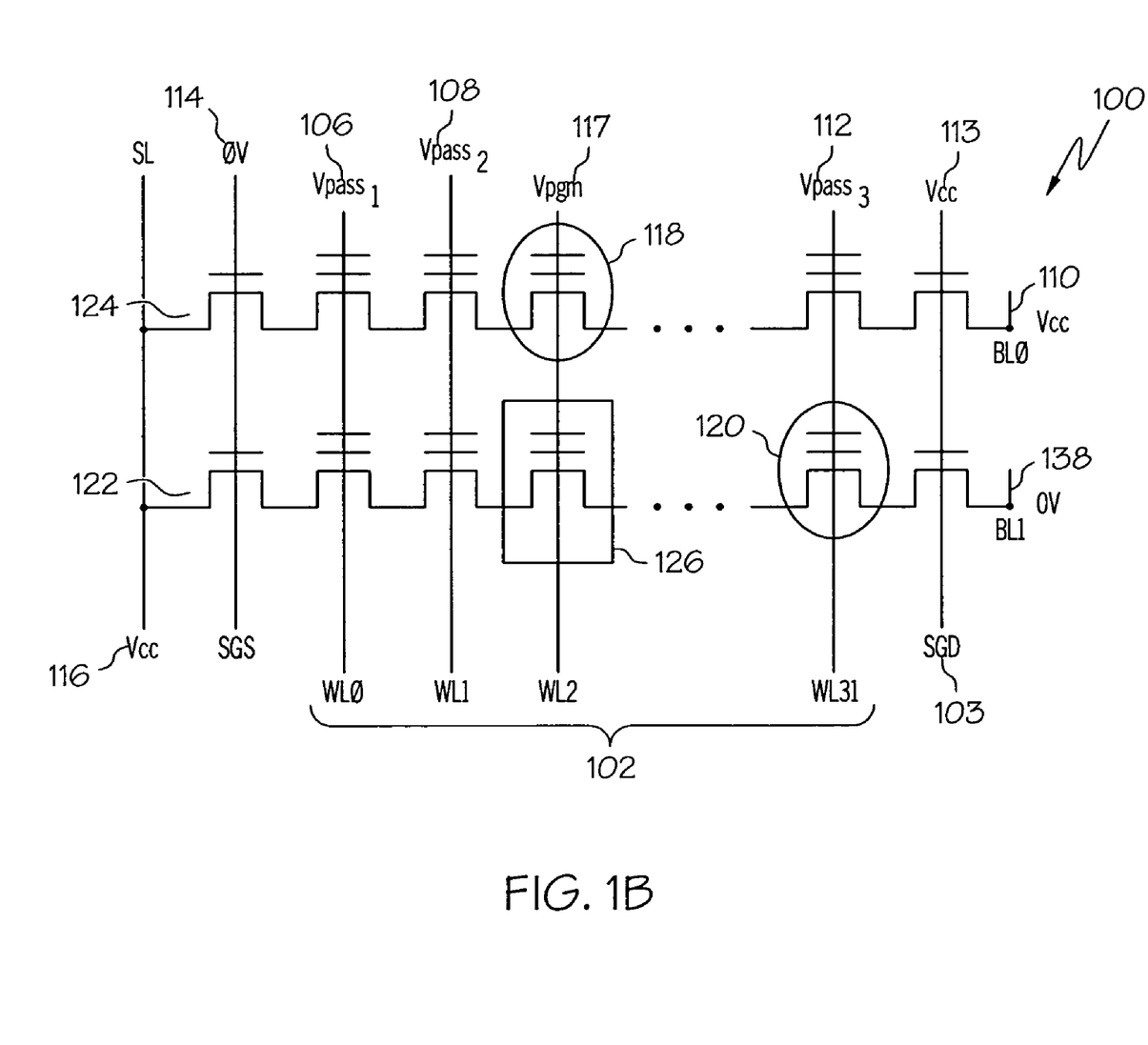
FIG. 1B depicts a diagram of a portion of a NAND memory apparatus.

Referring to FIG. 1B, a portion of a NAND memory array 100 is illustrated. The NAND memory array 100 could be implemented as the types of memories referred to in FIG. 1A. The array 100 can have a many rows and only two rows 122 and a 124 are illustrated. The NAND array 100 can have a string of field effect transistors each performing as a memory cell. In each row the first line of source gate select transistors can be coupled to the source gate select line (SGS) that can supply power to the string/row of transistors. A typical NAND architecture is a floating gate memory array where cells are accessed by a row decoder module (not shown). The row decoder module can activate each row of the floating gate memory cells by selecting the word select lines 102 coupled to the gates of the transistors/cells to read a desired cell. In the illustrated example, the word select lines 102 range from WL0 to WL31 (WL3-30 are omitted for simplification), however, any number of word lines could be utilized.

During the read operation, a Vread voltage can be applied to word lines such as WL0 106, WL 1 108 . . . WL 31 112 to control cells that are not being read. WL0 106, WL1 108, . . . WL31 112 can be coupled to the gates of the unselected memory cells and these cells can be driven to operate as pass transistors so that the transistors can pass current in a manner that is "unrestricted" by the cells in the string, yet the unselected transistor/cells can retain their data/stored value while passing this current representing data stored by a selected cell.

Alternately described, during a read operation, a read control signal can be provided to the cell that is selected to be read, and the selected cell can allow, or restrict current from the source lines 116 to the column bit lines 110 and 138 based on the charge stored by the cell/transistor gate, through each series coupled cell that passes the current. Thus, during a read operation, the current through the string 122 or 124 will be restricted only by the charges stored on the floating gate of the memory cell selected for the read and thus, the charge representing a bit of data can be "read" by the system. In one embodiment a charge stored by the floating gate of the selected cell will pass a current in the string. This places the "current encoded" data such as a logical 1 as read data on the column bit lines (i.e. 138 for string 122) during a read operation.

During a programming operation, pass voltages can be applied to unselected cells, and a programming voltage can be applied to the word line connected to the selected cell (WL2 117 in the example), a voltage can be applied to the source line 114, the drain line 113 and the bit line(s) 110, 138 to provide bias voltages. One problem in programming NAND architecture flash memory devices, is that the non-volatile memory cells proximate to the cell being programmed can be disturbed if the combination of Vpass voltages, channel boost voltages, and programming voltages (Vpgm) source line voltages and bit line voltages are not applied in the right proportion. Thus, the combination of control voltages during programming can have very important consequences because improved write performance and disturb performance can be achieved. When data is not stored properly during programming existing data can be disturbed or corrupted and serious failures can result.

During the programming procedure, the string selected for programming or bit line that is enabled (string 122) can be coupled via Vcc on drain select gate line (SGD) 113, and when the select gate is turned on, the bit line (BL1) 138 can be provided with a program selected voltage, such as 0V. In one embodiment, the memory array 100 can be programmed by programming word line zero (WL0) lower page (LP) first, word line one (WL1) (LP) second, WL0 upper page (UP) third, WL1 UP fourth and so on in multi-level programming. The channel of the selected string 122 can be tied to the voltage level of the bit line 138 such as 0V.

This configuration can apply a field across the selected memory cell 126 that causes carriers to be injected into the floating gate or charge trapping layer, altering the threshold voltage level (Vt) of the cell 126, thereby allowing the desired data value to be stored by the cell. Placing pass voltages on the unselected cells in the selected bit line can assist in grounding the channel voltages and with injecting the desired charge into the selected cell. During this operation, the selected memory string 122 can be isolated from the source line 116 (at Vcc) by placing zero volts on the source select gate line (SGS) 114 turning off the SGS 114 and restricting current flow or eliminating current flow in the channel/string.

The unselected memory cell 118 connected to the word line that is performing programming, (in memory string 124, WL2 has Vpgm applied) can be prevented from being programmed by having the drain select gate (SGD) transistor attached to SGD 114 in string 124 turned off, allowing the channels in string 124 to float and to be boosted typically about 5V to 8V. As stated above, cell disturb phenomena due to the programming volt placed on non-selected memory cells coupled to the word line that has the programming voltage can occur during a NAND programming operation. When such a disturb occurs a charge can be inadvertently injected into the floating gate of an unselected memory cell, altering its threshold voltage level thereby disrupting and changing the programming of the cell.

The two common types of disturbs during programming are commonly referred to as Vpgm-disturb and Vpass-disturb where stored data is disturb by one of these applied voltages. In Vpgm-program disturb, memory cells 118 that are on adjacent memory cell strings or bit lines or are coupled to the selected word line carrying the elevated programming voltage, can have an inadvertently large field applied across their channel and gate causing the charge and state of the cell to be disturbed. To avoid Vpgm-disturb, higher Vpass voltage is preferable in order to boost unselected channel voltage high enough. In Vpass-program disturb, memory cells 120 that are on the same memory string 122, but which are coupled to the pass voltage, Vpass, can inadvertently have a large field applied by a higher than needed Vpass voltage across their channel and gate and thereby disturbing the stored value. To avoid Vpass-disturb, lower Vpass voltage is preferable in order to maintain electric field on unselected WLs low enough.

Recent advance in EPROM or flash memory devices allows multiple bits to be stored in a single cell by utilizing multiple voltage threshold levels. Such multi-level programming has created additional problems regarding Vpass-disturbs and Vpgm disturbs. Such multiple bits/multiple voltage threshold levels can be created by "pumping" charges into the floating gates by writing consecutive pages to the gates, for example by writing a lower page and an upper page or a first page and a second page to the cells. The upper and lower pages can induce charges that defined multiple threshold voltages (Vt) of the memory cell, where the multiple threshold voltages can be utilized to read the multiple bits as determined when different read voltages are placed on the gate of the selected cells. Thus, the applied read voltage in addition to the stored charge can provide a read out for the different stored charges or multiple data in the cell.

A multi-value storing memory cell can store data of state "0", state "1", state "2", and state "3" whose threshold voltages increase in that order. In a lower page (LP) write operation, a memory cell whose data is in state "0" can be brought to 'LP' state. In an upper page (UP) write operation, a memory cell whose data is in state "0" can be brought into state "1" and a memory cell whose data is in state "LP" is brought into state '2' or state '3'. This programming sequence is described in FIG. 3. As a result, in reading the data, the data on the first page can be read in two read operations. Furthermore, the operation of writing the data onto the upper/second page can be made faster, because a high initial write voltage can be used. Table 1 below illustrates how data written to a cell can change the threshold voltage.

TABLE 1

| Data state in cell | Vth of cell | Data to be written to upper page | Data to be written to lower page |
|---|---|---|---|
| 0 | 0 v or below | 1 | 1 |
| 1 | .3 V to .8 V | 0 | 1 |

TABLE 1-continued

| Data state in cell | Vth of cell | Data to be written to upper page | Data to be written to lower page |
|---|---|---|---|
| 2 | 1.5 V to 2.0 V | 0 | 0 |
| 3 | 3 V to 4 V | 1 | 0 |

Thus, it can be appreciated how the threshold voltage of the cell can create three states of the cell where each state can be an indicator of a different data value stored by the cell. During upper page programming, the chance of Vpgm-disturbing unselected cells is greater than during lower page programming due to the higher Vpgm utilized where the increased electric field on unselected string can alter charges stored by the cell. When programming or setting a transistor gate such that it stores a value, a Vpgm disturbance generally does not pose a problem during lower page programming because of the lower programming voltage applied.

However, the higher Vpgm voltage utilized during programming of the upper page poses a greater risk of disturbing the value stored by the cell. Also, in the multi-level cell programming, the threshold voltage (Vth) of source side cells (source side cells can be already programmed while drain side cells are not programmed yet) are higher that degrades boosting efficiency and causes Vpgm-disturb. This problem becomes worse during drain-side WL programming because there are more source side WLs having higher threshold voltages.

In accordance with the present disclosure, an increased Vpgm during upper page programming (higher than lower page programming) and a combination ever increasing Vpass voltages with the increasing progression of programming cells closer to the bit line (higher Vpass as each higher numbered word line provides programming) can be utilized to ensure a successful write operation without disturbing unselected cells. Thus, Vpass can be increased for each based on the location of word line (or selected cell gate) that is undergoing programming. Accordingly, improved programming can be achieved by applying different voltages to the cells and other control devices in the memory. For example, proper voltages to generate a sufficient boosting in the string may require increasing the pass voltages on the cells in the direction of the programming procedure. Further, substrate boost voltages, and source and gate control voltages can greatly improve memory operation particularly during programming.

Accordingly, in one embodiment a programming voltage can be applied to a selected memory cell (a cell to be programmed) during a programming procedure, where the selected memory cell is part of a string of memory cells containing unselected memory cells (cells that are not to be programmed or disturbed). The string of cells can have a source side between the selected memory cell and a source line and the string can have a drain side between the selected memory cell and bit line where the memory cells can be read. In addition, pass voltages can be applied to the unselected memory cells and a programming voltage can be applied to the selected cell during a programming procedure. In one embodiment, a higher pass voltage can be applied to the unselected memory cells during upper page programming than during the lower page programming procedure.

As stated above, a typical programming procedure will cycle from word line zero to word line N, in this case WL31, programming WL0 lower page, WL1 lower page, WL0 upper page, WL2 lower page, WL1 upper page maintaining the sequence to word line N from the source line 114 to the bit line 138. During, the programming of utilizing WL0, all Vpass voltages can be substantially the same or can be consistent, for example seven volts. During programming of WL2 the Vpass can again remain consistent across all memory cells in a string; however Vpass can be increased during each successive programming of consecutive memory cells/word lines. For example, Vpass can be seven volts when WL0 is utilized for programming, Vpass can be seven and two tenths (7.2) volts when WL1 is utilized for programming, Vpass can be seven and four tenths (7.4) volts when word line two (WL2) is programmed and so on. In addition, the consecutive pass voltages can be raised by two volts during the programming of the upper page with respect to the lower page.

Thus, Vpass can be seven (7) volts for lower page WL0, nine (9) volts upper page WL0, 7.2 volts lower page WL1, 9.2 volts upper page WL1, 7.4 volts lower page WL2 and so on. As can be appreciated, the series of pass voltages can be arranged such that the pass voltages are higher during the upper page programming than during the lower page programming procedure. Further, higher pass voltages can be applied to the gates on the source side of the string (to the left of the selected word line) as the programming progression proceeds from WL0 to WLN. Thus, as the selected word line is incremented, raising the magnitude of one more Vpass as each word line is utilized for programming.

As stated above, it can be appreciated that utilizing an increasing Vpass voltage according to the program select word line being utilized for programming can provide improved operation of NAND based memories. It has been determined that applying consecutively higher pass voltages to cells in a string based on the location of the programming voltage in the string can lead to improved Vpgm-disturb performance. Further, the application of different voltages depending on whether the system is performing upper page programming and lower page programming can lead to improved memory performance.

Some cells are programmed to a higher threshold voltage during upper page programming and such programming requires a higher Vpgm voltage, however, this higher voltage can create Vpgm disturbs. Also, source-side cells can be programmed to higher Vt that can degrade the channel boosting efficiency created by the pass voltage. By utilizing a higher pass voltage during upper page programming and a higher pass voltage at the source side of the string during both upper and lower page programming boosting efficiency can be improved. The programming voltage Vpgm shown on WL2 117 applies a field that across the memory cell of the string selected for programming that causes carriers to tunnel to the floating gate or charge trapping layer, altering the threshold voltage level (Vt) of the selected memory cell and storing the data value. If a program-inhibit voltage placed upon the coupled bit line or source line 116, 110, 138 it is important that the applied field is not sufficient to tunnel carriers to the floating gate/node, even though the word line has a programming voltage on it and no data value is programmed and the memory cell can remain in an erased state (i.e. the cell above cell 126 which is being programmed).

In programming operations of the present disclosure, a programming voltage can be applied to a gate via a word line (i.e. WL2 117) to create a selected memory cell in the memory string. Thus, Vpass can be increase with each cycle during a programming operation such that the unselected cells operate as pass transistors, generating a channel of carriers by coupling the unselected memory cells allowing them to pass current in a manner that is relatively unrestricted by their stored data values yet not disturbing their charge. In addition, the bit line 138 and source line 114 can have an appropriate programming voltage placed on them.

Accordingly, during a lower programming a charge can be pumped into the gate and a programming voltage can be applied with higher Vpass voltages during the upper programming stage. Such a series of charges can create multiple threshold voltages in the cell. With upper page and lower page programming it can be assumed that four-level data, "00", "01", "10" and "11", can be stored in a memory cell. It can also be assumed that a state in which the threshold voltage of the memory cell is the lowest (e.g., a threshold voltage is negative) is data "11" (or a "0" state), a state in which the threshold voltage of the memory cell is the second lowest (e.g., the threshold voltage is positive) is data "01" (or a "1" state), a state in which the threshold voltage of the memory cell is the third lowest (e.g., the threshold voltage is positive) is data "00", (or a "2" state), and a state in which the threshold voltage of the memory cell is the highest (e.g., the threshold voltage is positive) is data "10" (or a "3" state).

In addition, when four-level data is stored in a memory cell, upper level data program/read operations and lower page data program/read operations can be required. In this case, with threshold voltages of the levels "**", it can be assumed that the right "*" is lower page data and the left "*" is upper page data. Further, as for the state of a memory cell, it is assumed that a state in which data "11" is stored is an erase state, and states in which data "10", "00" and "01" are stored are program states.

Alternately described a multi-valued memory cell can have data of state "0", state "1", state "2", and state "3" whose threshold voltages increase in that order. In a lower/first-page write operation, a memory cell whose data is in state "0" can be brought into state "LP" In an upper-page write operation, a memory cell whose data is in state "0" can be brought into state "1" and a memory cell whose data is in state "LP" can be brought into state '2' or '3.' As a result, in reading the data, the data on the lower page can be read in two read operations. Furthermore, the operation of writing the data onto the upper page can be made faster, because a high initial write voltage can be utilized. If a program-inhibit voltage placed upon the coupled bit line or source line, the applied field may not be sufficient to tunnel carriers to the floating gate/node, where no data value will be programmed and the memory cell can remain in the erased state. In accordance with the present disclosure, during programming a Vpass configuration can improved the chances of not disturbing adjacent cells (referred to as Vpass-disturb) where the Vpass configuration can ensure that the appropriate/target cells can receive and retain/store the appropriate value. It can be appreciated that the disclosed method utilizes a higher Vpass when the charge on the floating gates becomes higher with consecutive write cycles. Although a lower Vpass voltage is utilized on unselected cell proximate to the bit line 138 and a higher Vpass voltage can be utilized on cells proximate to the SGS line 122 so that enough channel boosting voltage is maintained even if source side cells have higher Vth while Vpass-disturb of drain side is minimized.

Also, in accordance with the present disclosure significant programming improvements can be achieved during upper page programming and drain side word line programming utilizing a higher Vpass voltage particularly with a higher Vpass on source side of the activated word line. Thus, a higher pass voltage to provide improved channel boosting is desirable as long as unselected cells are not disturbed.

Significant programming performance can be achieved by applying a higher Vpass voltage to cells in a string during upper page programming or when the initial/first programming pulse is applied. For example, Vpass could be eight volts and Vpgm could be fifteen volts during lower page programming and Vpass could be ten volts and Vpgm could be twenty volts during upper page programming. In this case, the word line voltage on WL0 could be five volts to reduce the likelihood of disturbing cells near the source line 114 while still providing the required current from the source line 116.

Applying a higher Vpass voltage at the source side of the string during programming and/or increasing the Vpass voltage along the source side of the string according to the location of the program selected WL can improve the programming success rate and reduce the number of programming disturbances. Thus, the disclosed arrangements can separate a Vpass "trim" between upper page and lower page where the application of Vpass to the gates is changes with the progression of the word line performing the programming. Accordingly, Vpass can be lower for WL1 106 and higher for WL31 113 during the upper page/lower page programming process and Vpass for all word lines can be higher for upper page programming than for lower page programming.

Alternately described, cells in the string can be have a hierarchy as observed from the SGS line 116 to the bit line 138 such as WL0-WL31 102 as shown below the bottom string. In accordance with the present disclosure, the pass voltages, Vpass, applied during programming of a cell can be achieved in accordance with a hierarchy where cells that are closer to the bit line can be supplied with a higher Vpass voltage than the cells that are closer to the Vcc or SGS line. Such a hierarchy can provide a better trade off between Vpass induced disturbs and Vpgm induced disturbs. Generally, Vpgm disturb is not a significant issue during lower page programming because of the lower programming voltage applied while Vpass disturb is still a problem during lower page programming.

Thus, in accordance with another embodiment during programming of the upper page, Vpass for the upper page can be higher than during lower page programming procedure for cells between the source line 116 and the cell to be programmed (i.e. WL2) and Vpass for cells between the cell being programmed and the bit line 138 can be provided with the same voltage as was applied in the first/lower lower page programming procedure. Thus, the drain side cells of the string herein refers to cells that are between the cell being or to be programmed and the bit line 138 and the source side cells are referred to as cells that are between the cell being programmed and the bit line 138. In the example, WL1 and WL2 provide Vpass to the source side, WL3 provides the cell undergoing programming and WL4-WL31 are drain side cells.

The hierarchical Vpass can apply an ever increasing field across the memory cell string to be programmed for each consecutive programming operation assisting the programming process where carriers tunnel to the floating gate or charge trapping layer, altering the threshold voltage level (Vt) of the selected memory cell resulting in a stored data value. An upper page/lower page configuration can be referred to as a multi-level cell (MLC) configuration. In a MLC configuration each cell can have one of four different threshold voltage levels (Vt) created during programming where the threshold levels will determined if the cell will pass or inhibit the current (i.e. provide a zero or a one when the cell is read). Thus, the threshold voltage of a cell can depend upon the amount of charge stored in the floating gate. When four threshold voltages are programmed (Vt levels (L0,L1,L2, L3)) the programming can correspond to a data pattern of "11", "01", "00" and "10", where "10" means "upper page=1 and lower page=0."

As stated above, a lower Vpass can provide improved operation for Vpass disturb and a higher Vpass can provide improved operation for Vpgm disturb. A higher Vpass on the source side can provide improved results for upper page programming (i.e. less chance for a disturbance and greater chance for a successful write to the cell being programmed. In one embodiment the voltage setting to inhibit Vpass in a WL voltage can apply a higher Vpass for the source side in upper page programming. Applying a higher Vpass during upper page programming at the source side only, can be viewed as providing similar improvement in programming similar to a higher Vpass for lower page programming voltages and improved drain side of the upper page programming. Separate Vpass trim voltages between upper page and lower page programming where Vpass is changed according to the program selected word line (higher Vpass for WL31 etc) can also provide improved programming operation.

Figure 2:
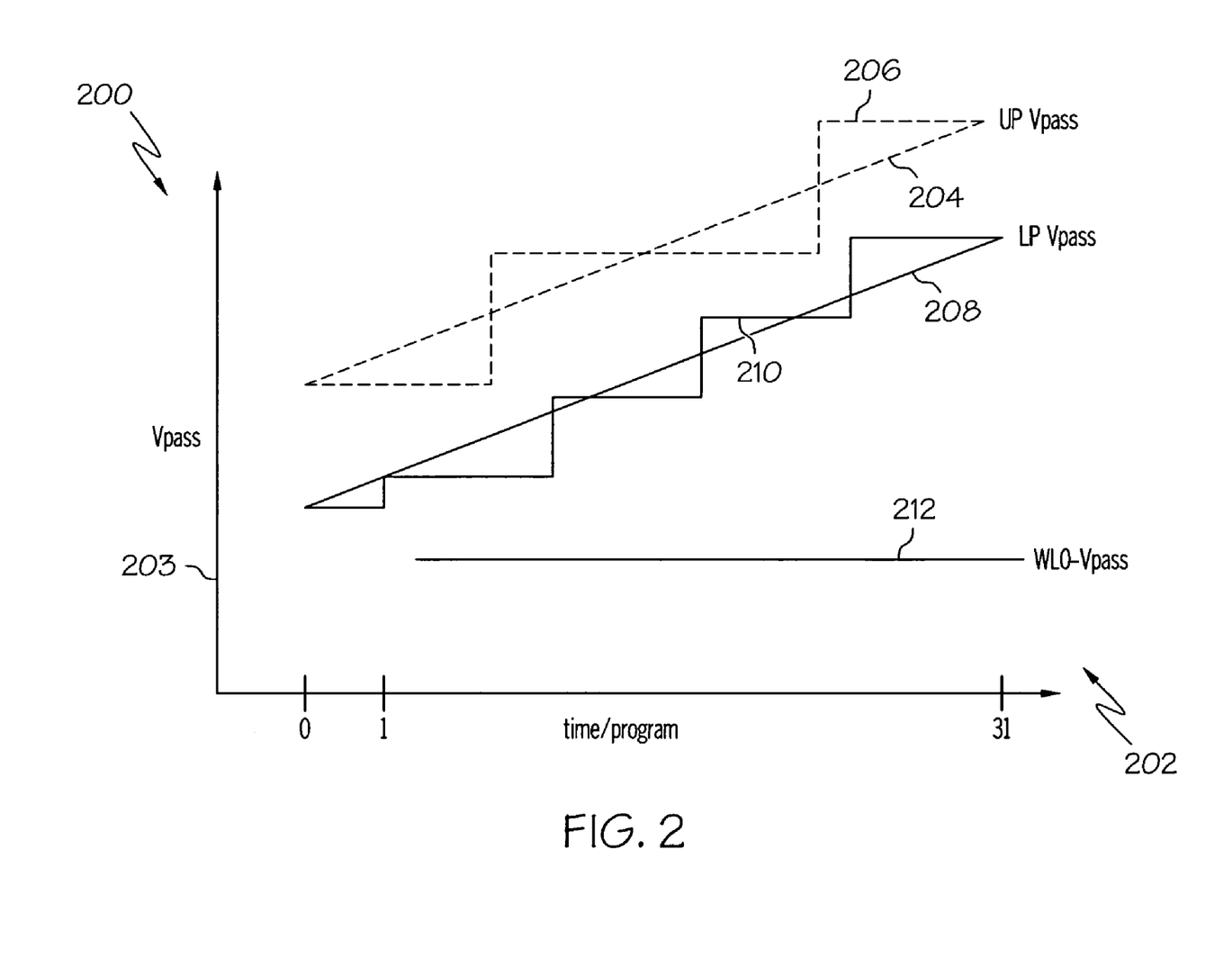
FIG. 2 is a graph of programming voltages as a function of memory cell position.

Referring to FIG. 2, a graph 200 illustrating a linearly increasing the Vpass voltage and step increasing Vpass voltage for consecutive program selected word lines for both an upper page and lower page is disclosed. The X axis of the graph is the program selected word line but can also be viewed as time because word line one can be programmed first word line tow second etc. As stated above, lower page word line N can be programmed first, lower page word line N can be programmed second, upper page word line N can be programmed next where Vpass is increased for each upper page and for each cycle/successive word line.

The word lines zero through thirty one (WL0-WL31) are illustrated along the horizontal axis 202, and a pass voltage Vpass is illustrated on the vertical axis 203. For lower page programming, Vpass for word line one and word line thirty one can be the same and for lower page programming Vpass can again be the same yet higher than the pass voltage utilized during the lower page. It can be appreciated how a line 204 illustrating the upper page programming voltage is higher than the line 208. Lines 204 and 208 illustrate a linear approach to programming that utilizes an increasing Vpass voltage as consecutive cells are programmed.

Lines 206 and 210 illustrate utilizing a voltage stepping approach to applying Vpass to the hierarchy of consecutive memory cells as a linear increase or even a stepping increase in voltage should not be viewed as a limiting factor. Line 212 illustrates the voltage that can be utilized for write line zero which in one embodiment can remain constant. As illustrated in FIG. 2, the system disclosed can utilize a combination of higher Vpass for higher word line programming (a hierarchical voltage progression) and a higher Vpass when upper page programming is performed. In another embodiment, utilizing the known Vpass disturb trade off Vpass can be increase only for upper page programming for cells on the source side of the cell being programmed.

Separate Vpass "trim" voltages between upper page and lower page programming can be utilized where Vpass is changed according to the location of the program select word line. Thus, during lower page programming, Vpgm can be approximately 15 volts and Vpass on WL 1 108 can be approximately 8 volts. During upper page programming higher a Vpgm can be on the order of 20 volts and higher Vpass can be on the order of 10 volts. Such an increased voltage for upper page programming can create a better trade off between Vpass disturb and Vpgm disturb. The disclosed embodiments can utilize both a higher Vpass such as 8 to 10 volts for upper page programming and for source side word line programming.

In another embodiment, Vpass increase can be implemented on source side word lines only during upper page programming. Here, the source side word lines are word lines between the program selected word line and the source side select gate. Since programming is implemented sequentially from WL0 (source side) to drain side, source side word lines may have a higher Vt that degrades boosting efficiency and has a higher likelihood of causing a Vpgm disturb. By applying a higher Vpass on only the source side word lines, channel boosting can be improved with minimum degradation of Vpass disturbance properties. These bias conditions are shown in Table II.

TABLE II

Vpass voltage during WLn programming

|  | LP programming | UP programming |
| --- | --- | --- |
| WL0 | Vpass_wl0 | Vpass_wl0 |
| Source side WLs | Vpass lp | Vpass up source side (>Vpass up drain side) |
| Drain side WLs | Vpass lp | Vpass up drain side |

It can be appreciated that Vpass_lower page and/or Vpass-upper page on the source-side and/or Vpass-upper page-drain-side can be increased according to the program selected WLs as shown in FIG. 2. Also Vpass upper page source side can be higher than Vpass upper page drain side to improve Vpgm disturb properties with minimum degradation of Vpass disturb properties. Vpass on the upper page drain side can be the same as the Vpass provided by the lower page.

Figure 3:
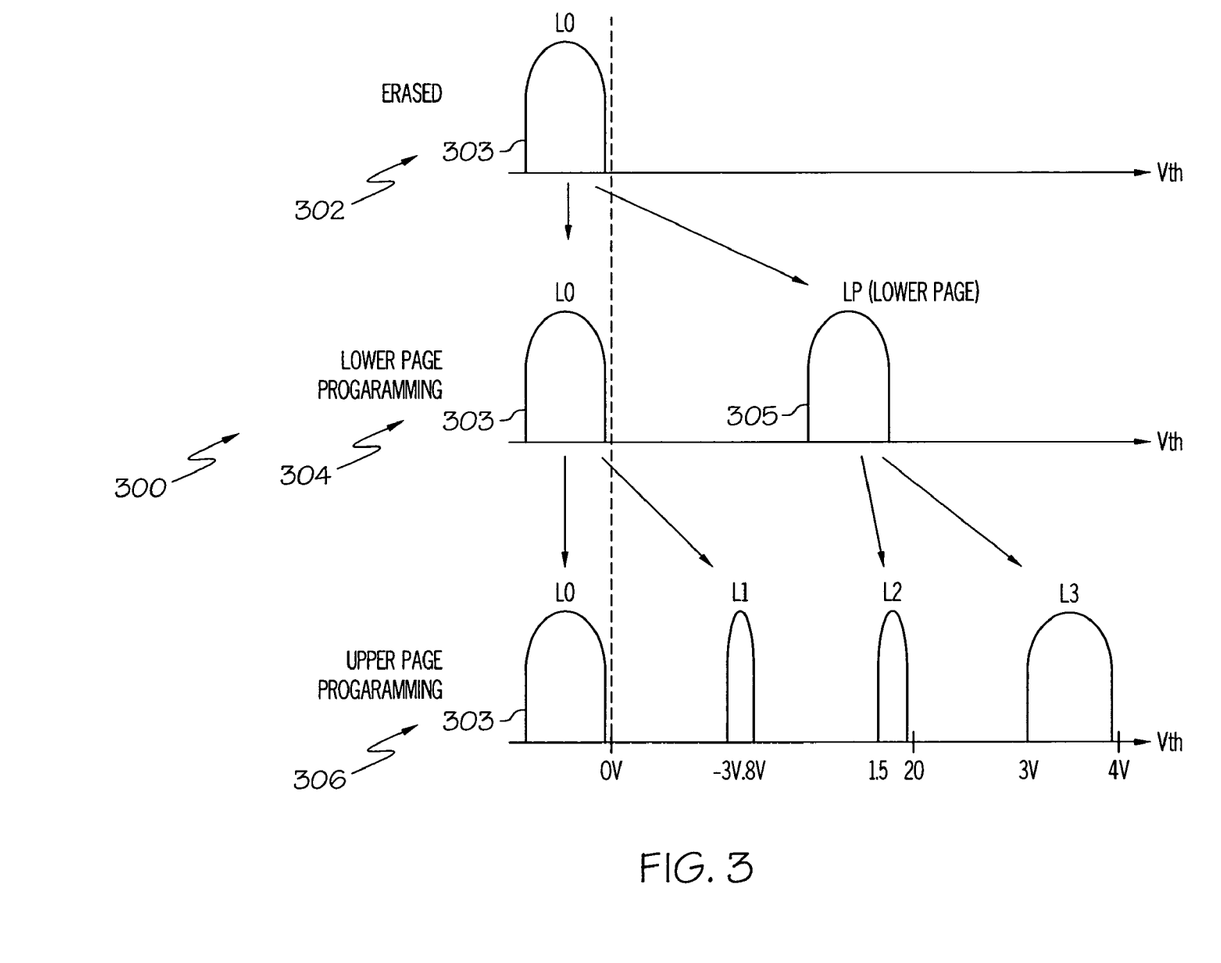
FIG. 3 is a graph of threshold voltage ranges resulting from upper and lower page programming.

Referring to FIG. 3 graphs 300 illustrating an "erase" state, an upper page programmed state and a lower page programmed state is disclosed. In the erased state, a cell can have a relatively low threshold voltage as illustrate by line 302. After lower page programming, illustrated by graph 304, the threshold voltage can be increased by injecting a charge into the floating gate of the cell, and increasing the threshold voltage as illustrated by line 305.

After upper page programming, illustrated by graph 306, four threshold voltage ranges can result, represented by L0, L1, L2, and L3. Referring briefly back to Table 1 above, the threshold voltages shown in Table 1 are represented generally on the X-axis or Vth axis of the graph 304. Thus, multiple threshold voltages for each cell can be created utilizing upper page and lower page programming. As stage above such a programming configuration can be economically achieved when Vpass is increased at source side WLs only during upper page programming.

Figure 4:
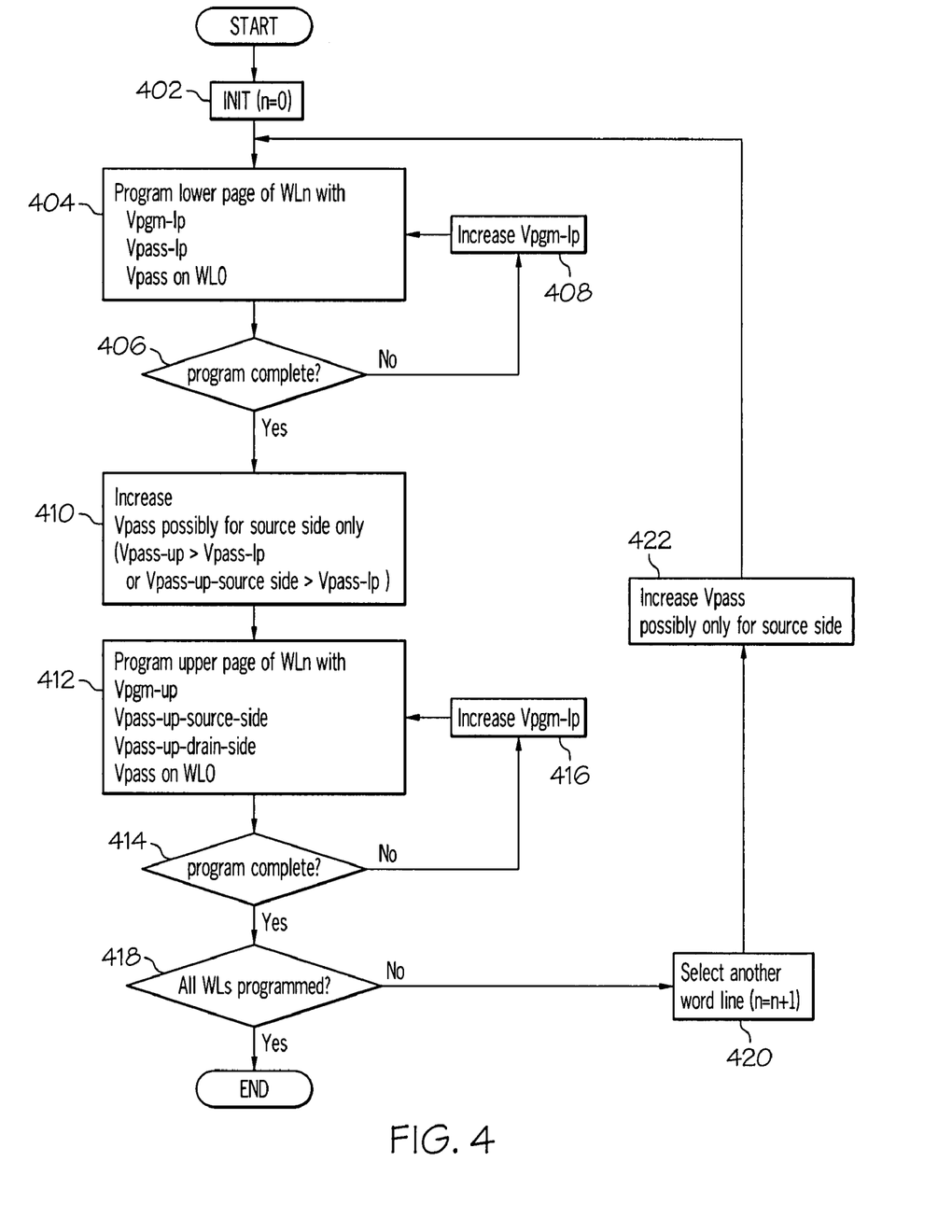
FIG. 4 is a flow diagram of how to operate a NAND memory system.

Referring to FIG. 4, a flow diagram 400 illustrating a method for programming a memory array is illustrated. As illustrated by block 402, programming is performed from WL0. As illustrated by block 404, lower page programming can be performed by selecting word lines. The programming procedure can provide a Vpgm voltage on the selected word line and a Vpass voltage on unselected cells. Vpass can be consistent (or the same voltage across the string) for each selected word line during programming of a cells on the string. As illustrated by decision block 406, it can be determined if lower page programming for a cell has been achieved. If programming is not complete, the lower page programming can continue with step up Vpgm voltages until lower page programming is complete.

After the cells have been lower page programmed, as determined as illustrated by decision block 406, that Vpass can be increased as illustrated by block 410. Accordingly, the Vpass voltage can be greater for upper page programming than for lower page programming. In one embodiment, Vpass can be increased during the programming only for cells in the source side, (i.e. on cells between the selected word line and the source line or to the left of the selected cell in FIG. 1). In another embodiment, Vpass can be increased for cells on the source side for upper page programming (i.e. Vpass can be greater on the source side during upper page programming than on the source side during lower page programming).

As illustrated by block 412, a cell can upper page programmed utilizing Vpgm for the upper page, Vpass on the source side during upper page programming and Vpass on the drain side. At decision block 414, if all cells have not been programmed, the Vpgm can be increased as illustrated in block 416. If the cell has been programmed then it can be determined at decision block 418 if all word lines have provided programming. If they have, the process can end. If they have not, another word line can be selected and Vpass can be increased as illustrated by block 422. In one embodiment, Vpass is only increased for the source side. In another embodiment, a different programming sequence is described, the programming sequence can be word line (N) lower page (WL(N)-LP) then (WL(N+1)(LP)) then (WL(N)(UP))-> (WL(N+2) (LP)) then (WL(N)+1(UP) and so on. However, to simplicity the flow in FIG and explanation purpose, FIG. 4 describes WLn(LP)->WLn(UP).

Each process disclosed herein can be implemented with a software program. The software programs described herein may be operated on any type of computer, such as personal computer, server, etc. Any programs may be contained on a variety of signal-bearing media. Illustrative signal-bearing media include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); and (iii) information conveyed to a computer by a communications medium, such as through a computer or telephone network, including wireless communications. The latter embodiment specifically includes information downloaded from the Internet, intranet or other networks. Such signal-bearing media, when carrying computer-readable instructions that direct the functions of the present disclosure, represent embodiments of the present disclosure.

The disclosed embodiments can take the form of an entirely hardware embodiment, an entirely software embodiment or an embodiment containing both hardware and software elements. In one embodiment, the arrangements can be implemented in software, which includes but is not limited to firmware, resident software, microcode, etc. Furthermore, the disclosure can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device.

The control module can retrieve instructions from an electronic storage medium. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk–read only memory (CD-ROM), compact disk-read/write (CD-R/W) and DVD. A data processing system suitable for storing and/or executing program code can include at least one processor, logic, or a state machine coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

It will be apparent to those skilled in the art having the benefit of this disclosure that the present disclosure contemplates methods, systems, and media that can control a memory circuit. It is understood that the form of the arrangements shown and described in the detailed description and the drawings are to be taken merely as examples. It is intended that the following claims be interpreted broadly to embrace all the variations of the example embodiments disclosed.

What is claimed is:

1. A method comprising:
   applying a programming voltage to a selected memory cell during a lower page programming procedure wherein the selected memory cell is part of a string of memory cells containing unselected memory cells and wherein the string of cells have source side memory cells located between the selected memory cell and a source line and have drain side memory cells located between the selected memory cell and a bit line;
   applying pass voltages to the unselected cells during the lower page programming procedure;
   applying a programming voltage to the selected memory cell during an upper page programming procedure; and
   applying pass voltages to the unselected memory cells during the upper page programming procedure, wherein a higher pass voltage is applied to at least one of the source side memory cells during the upper page programming procedure than is applied to the drain side memory cells during the upper page programming procedure.

2. The method of claim 1, further comprising applying a higher pass voltage to at least one of the source side memory cells during the lower page programming procedure than is applied to the drain side memory cells during the lower page programming procedure.

3. The method of claim 1, wherein further comprising applying a higher pass voltage to all of at least one source side memory cells than to the drain side memory cells during the upper page programming procedure.

4. The method of claim 1, further comprising applying a lower pass voltage to at least one of the drain side memory cells than to at least one drain side memory cell during the upper page programming procedure.

5. The method of claim 1, further comprising applying a first programming voltage to the selected cell during the lower page programming and applying a second programming voltage to the selected cell during an upper page programming, wherein the second programming voltage is greater then the first programming voltage.

6. A method comprising:
   applying a programming voltage to a selected memory cell during a cell programming procedure, the selected memory cell part of a string of cells containing unselected memory cells, the string of cells having a source side between the selected memory cell and a source line and having a drain side between the selected memory cell and bit line; and
   applying a series of pass voltages to the unselected memory cells during the cell programming procedure, the series of pass voltages arranged such that the pass voltages applied to the source side of the string are higher than the pass voltages applied to the drain side of the string during an upper page programming procedure.

7. The method of claim 6, applying a series of pass voltages to the unselected memory cells during the cell programming procedure, the series of pass voltages arranged such that the pass voltages applied to the source side of the string are higher than the pass voltages applied to the drain side of the string during an lower page programming procedure.

8. The method of claim 6, further comprising programming memory cells from a source side to a drain side utilizing N word lines (WL).

9. The method of claim 8, wherein programming comprises a sequence defined by accordance with (WL(N) lower page) then (WL(N+1)(Lower page)) then (WL(N) (Upper page)) then (WL(N+2) (Lower page)) then (WL(N)+1(Upper page).

10. A system comprising:
    a source line;
    a string of memory cells, having a first end coupled to the source line and a series of gate lines, wherein one memory cell in the string of memory cells is selected to be via the series of gate lines;
    a bit line coupled to a second end of the string where the string has a drain side between the selected cell and the bit line and a source side between the the selected cell; and
    a controllable voltage source coupled to the series of gate lines to provide a plurality of pass voltages to the series of gate lines in the string of memory provide an upper page programming voltage and a lower page programming voltage to the selected cell wherein a higher pass voltage is applied to at least one of the source side memory cells during the upper page programming procedure than is applied to the drain side memory cells during the upper page programming procedure.

11. The system of claim 10, wherein the controllable voltage source provides a higher pass voltage for the memory cells on the source side during a lower page programming.

12. The system of claim 10, wherein the controllable voltage source provides a higher pass voltage for the memory cells on the source side during an upper page programming.

13. The system of claim 10, wherein the controllable voltage source provides first pass voltage on the drain side during a lower page programming and provides the first pass voltage on the drain side during an upper page programming.

14. The system of claim 10, wherein the series of pass voltages are selected to minimize pass voltage based disturbs and to minimize program voltage based disturbs.

* * * * *

UNITED STATES PATENT AND TRADEMARK OFFICE
CERTIFICATE OF CORRECTION

PATENT NO. : 7,508,711 B2  Page 1 of 1
APPLICATION NO. : 11/796836
DATED : March 24, 2009
INVENTOR(S) : Akira Goda

It is certified that error appears in the above-identified patent and that said Letters Patent is hereby corrected as shown below:

In column 14, line 37, in Claim 10, before "via" insert -- programmed --.

In column 14, line 40, in Claim 10, before "selected" delete "the".

Signed and Sealed this

Sixteenth Day of June, 2009

JOHN DOLL
*Acting Director of the United States Patent and Trademark Office*